United States Patent
Chang et al.

(10) Patent No.: US 8,207,602 B2
(45) Date of Patent: *Jun. 26, 2012

(54) HIGH VOLTAGE AND HIGH POWER BOOST CONVERTER WITH CO-PACKAGED SCHOTTKY DIODE

(75) Inventors: Allen Chang, Fremont, CA (US); Wai-Keung Peter Cheng, Union City, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/784,391

(22) Filed: May 20, 2010

(65) Prior Publication Data

US 2010/0225296 A1    Sep. 9, 2010

Related U.S. Application Data

(63) Continuation of application No. 11/761,313, filed on Jun. 11, 2007, now Pat. No. 7,750,447.

(51) Int. Cl.
*H01L 23/495* (2006.01)
*H01L 23/48* (2006.01)
*G05F 1/00* (2006.01)

(52) U.S. Cl. .......... 257/676; 257/777; 323/222
(58) Field of Classification Search .......... 257/676, 257/777; 323/222, 282
See application file for complete search history.

(56) References Cited

U.S. PATENT DOCUMENTS

| | | | |
|---|---|---|---|
| 4,344,081 A | 8/1982 | Pao et al. | |
| 5,126,807 A | 6/1992 | Baba et al. | |
| 5,242,845 A | 9/1993 | Baba et al. | |
| 5,260,227 A | 11/1993 | Farb et al. | |
| 5,578,508 A | 11/1996 | Baba et al. | |
| 5,965,947 A | 10/1999 | Nam et al. | |
| 5,998,833 A | 12/1999 | Baliga | |
| 6,621,121 B2 | 9/2003 | Baliga | |
| 6,699,775 B2 | 3/2004 | Bol et al. | |
| 7,195,952 B2 * | 3/2007 | Vinn et al. | 257/676 |
| 7,436,070 B2 | 10/2008 | Uno et al. | |
| 7,750,447 B2 * | 7/2010 | Chang et al. | 257/676 |
| 2004/0169262 A1 * | 9/2004 | Oliver et al. | 257/676 |
| 2006/0073023 A1 | 4/2006 | Ghoshal et al. | |
| 2008/0035987 A1 | 2/2008 | Hebert | |
| 2008/0067584 A1 | 3/2008 | Lui | |
| 2008/0304305 A1 | 12/2008 | Chang et al. | |
| 2008/0304306 A1 | 12/2008 | Chang et al. | |

FOREIGN PATENT DOCUMENTS

| | | |
|---|---|---|
| CN | 1691327 A | 11/2005 |
| TW | 200524260 A | 7/2005 |
| WO | 2006020921 A2 | 2/2006 |

OTHER PUBLICATIONS

Chinese Office Action dated Nov. 27, 2009 issued for Chinese patent application No. 2008101098622.

(Continued)

*Primary Examiner* — Jue Zhang
(74) *Attorney, Agent, or Firm* — Joshua D. Isenberg; JDI Patent

(57) ABSTRACT

A high voltage and high power boost converter is disclosed. The boost converter includes a boost converter IC and a discrete Schottky diode, both of which are co-packaged on a standard single common die pad.

8 Claims, 4 Drawing Sheets

OTHER PUBLICATIONS

Office Action dated May 11, 2009 issued for U.S. Appl. No. 11/761,313.
Final Office Action dated Dec. 10, 2009 for U.S. Appl. No. 11/761,313.
Zetex Semiconductors, Datasheet for ZXD1615, Aug. 2004, Issue 3, pp. 1-12.
Notice of Allowance and Fee(s) Due dated Feb. 22, 2010 for U.S. Appl. No. 11/761,313.

* cited by examiner

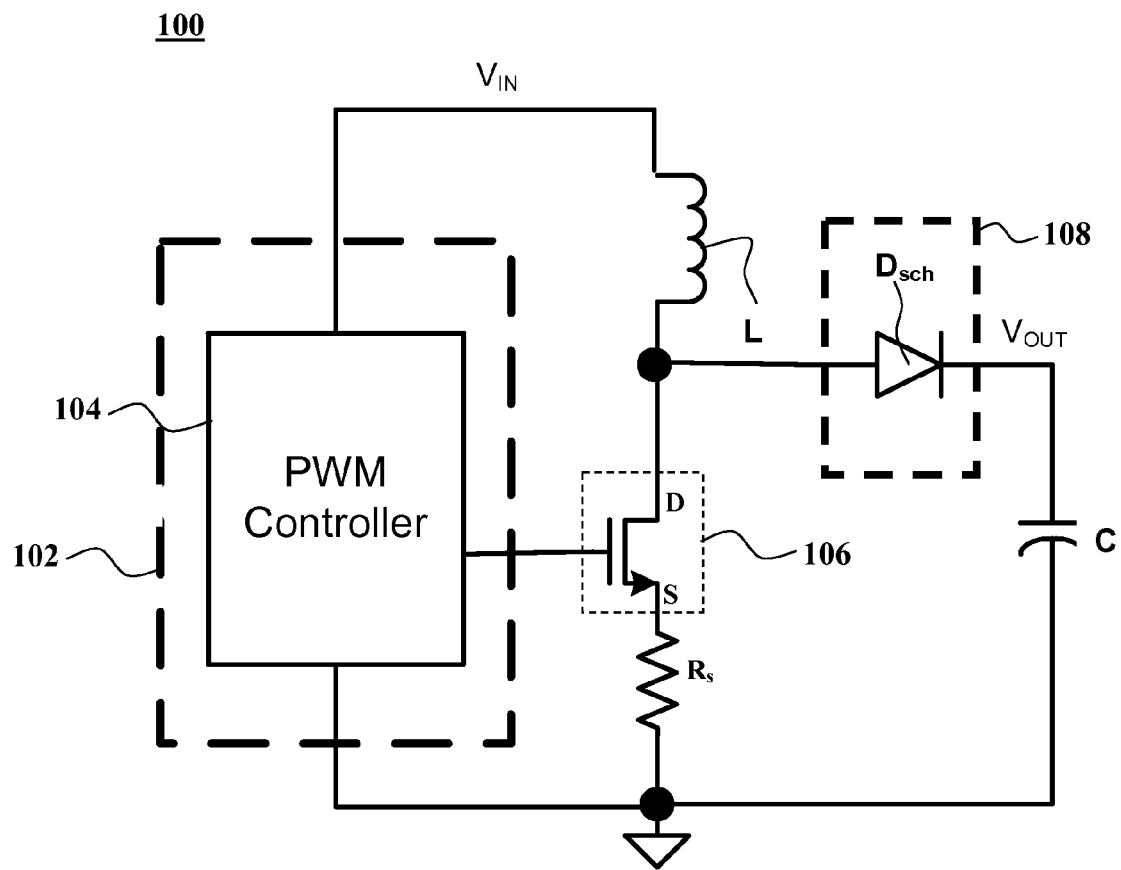
FIG. 1 – Prior Art

HIGH VOLTAGE AND HIGH POWER BOOST CONVERTER WITH CO-PACKAGED SCHOTTKY DIODE

CLAIM OF PRIORITY

This application is a continuation of and claims the priority benefit of commonly-assigned, U.S. patent application Ser. No. 11/761,313 entitled "HIGH VOLTAGE AND HIGH POWER BOOST CONVETER WITH CO-PACKAGED SCHOTTKY DIODE" to Allen Chang and Wai-Keung Peter Cheng, filed Jun. 11, 2007, the entire disclosures of which are incorporated herein by reference.

CROSS-REFERENCE TO RELATED APPLICATIONS

This application is related to co-pending application Ser. No. 11/761,301, to Allen Chang and Wai-Keung Peter Cheng, entitled "BOOST CONVERTER WITH INTEGRATED HIGH POWER DISCRETE FET AND LOW VOLTAGE CONTROLLER", filed Jun. 11, 2007, the entire disclosures of which are incorporated herein by reference.

FIELD OF THE INVENTION

This invention generally relates to boost converters and more particularly to high voltage and high power Boost converters having a co-packaged Schottky diode.

BACKGROUND OF THE INVENTION

Boost converter circuit is used to boost an input voltage to a higher output voltage. A boost ratio of ten or more is possible, e.g., in portable display applications. A boost converter may be used, e.g., to power a string of white LED diode for LCD backlight. In such situations boost converter may be used to convert a five volt input to an output voltage of up to 50V. A boost converter generally includes five basic components, namely a power semiconductor switch, a diode, an inductor, a capacitor and a modulation controller, such as a pulse width modulation (PWM) controller. There are many different kinds of control systems, pulse width modulation (PWM) is only one of them.

High Voltage and High Power Step-Up, or Boost, Converter are used in many applications such as LCD panel power supplies or LED backlight drivers. A small form factor for the total solution is needed as PCB space is always limited. Reduced PCB area also serves to reduce the manufacturing cost.

FIG. 1 is a circuit diagram of a boost converter integrated circuit (IC) 100 of Prior Art. As shown in FIG. 1, boost converter circuit 100 includes a low voltage integrated circuit (IC) containing a pulse-width modulation (PWM) controller 104 mounted to a first die pad 102, an external sense resistor Rs and an external high voltage NFET 106. An inductor L may be directly coupled between the input voltage $V_{IN}$ of the controller 104 and a drain D of the NFET 106. An external sense resistor Rs may be coupled between a source S of the NFET 106 and ground. An external high voltage (HV) Schottky diode $D_{Sch}$, and a capacitor C are coupled in series between the drain D and the ground. An output voltage $V_{OUT}$ may be obtained at a point between the Schottky diode $D_{Sch}$, and the capacitor C. There may be a voltage drop $V_{DIODE}$ across the Schottky diode. The Schottky diode is bonded to a second die pad 108.

Boost converters of the type shown in FIG. 1 having an integrated FET in a small package have been successfully introduced. However, such boost converters use an external discrete Schottky diode. Unfortunately, most integrated Schottky diodes available in commercial IC processes do not have the area efficiency required to meet either the Power (Current) or Voltage requirement. For high power operation, the junction area of the diode must be large so that the diode can carry high current and sustain high voltage.

Co-Packaging of a Schottky diode and an IC has appeared in commercial boost converters intended for LCD backlight. An example of a serial LED driver with a current-regulated, step-up DC/DC converter is a FAN5606, made by Fairchild Semiconductor. This device has a built-in Schottky diode and does not require an external Schottky diode. However, although the Schottky diode may be co-packaged with the IC, such a boost converter requires two die pads, one for the IC and one for the diode, which limits the active area of the components that can be included in a given package. This dictates a larger package form factor. In addition, production costs for such devices tend to be high due to the assembly complexity and the cost of the lead frame for the two die pads.

It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIG. 1 is a circuit diagram of a boost converter of the Prior Art.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 2A:
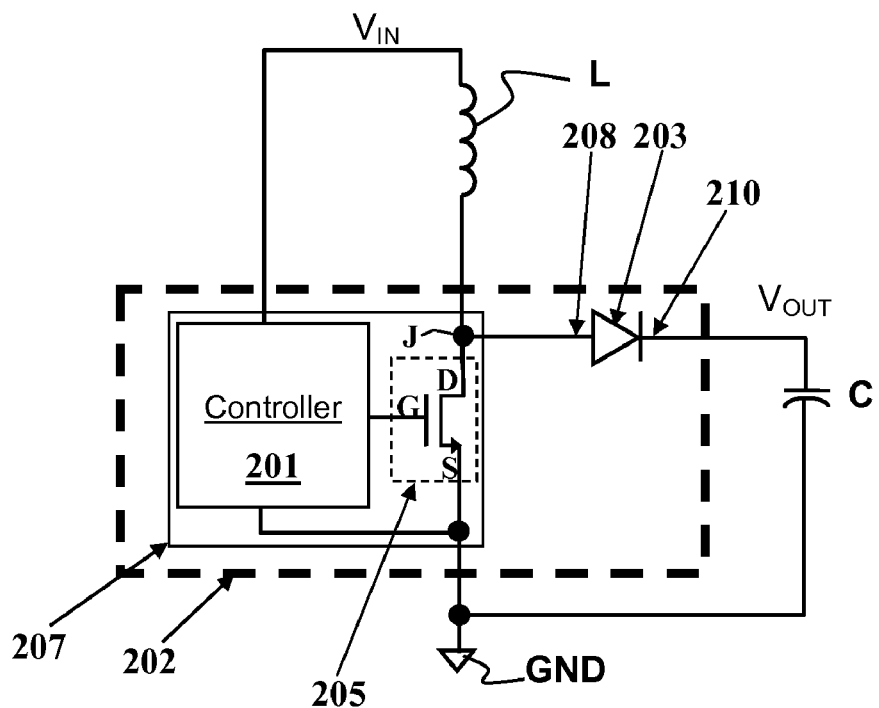
FIG. 2A is a circuit diagram of a boost converter according to an embodiment of the present invention.
Figure 2B:
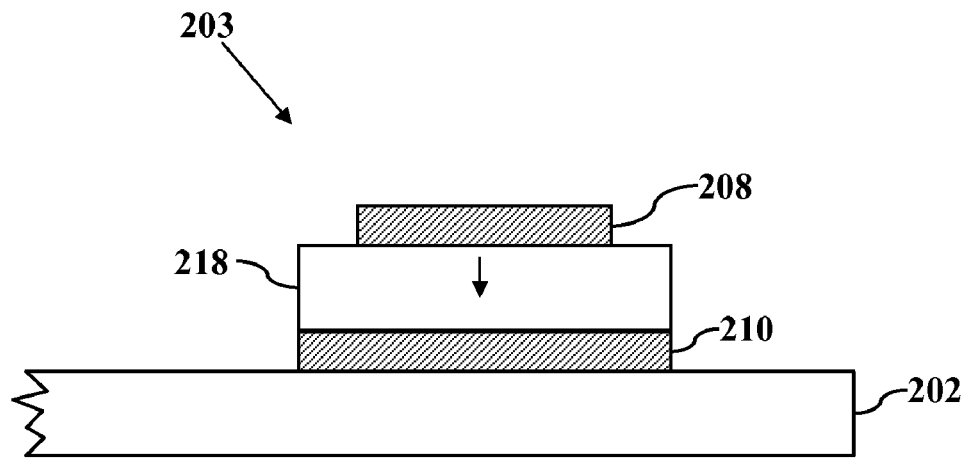
FIG. 2B is a vertical cross-sectional diagram of a portion of the boost converter of FIG. 2A.

FIG. 2A is a circuit diagram illustrating a boost converter 200 according to a preferred embodiment of the present invention. As shown in FIG. 2A, boost converter 200 includes a boost converter IC 207 attached to and electrically insulated from a die pad 202 and a vertical discrete Schottky diode 203 attached to and electrically connected from the same die pad 202. The boost converter IC may include a controller 201 and a high voltage N-type field effect transistor (NFET) 205 with a source S, a drain D and a gate G. The controller 201 and the NFET 205 may be formed on a common semiconductor chip. By way of example, the boost converter IC may be a Model EL7516 PWM Step-Up Regulator from Intersil Corporation of Milpitas, Calif. As shown in FIG. 2B, the vertical discrete Schottky diode 203 may include a layer of doped semiconductor 218 (e.g., N-type silicon) between metal contacts that provide a top anode 208 and a bottom cathode 210. The bottom cathode 210 may be in direct electrical contact with the die pad 202. As used herein, a top anode refers to an anode located in a layer at or near a top layer of a vertical diode structure and a bottom cathode refers to a cathode located in a layer at or near a bottom layer of the vertical diode structure. The diode structure is said to be vertical where the diode current flow is directed more or less perpendicular to the layers making up the diode structure, e.g., as indicated by the arrow in FIG. 2B. By way of example, and without loss of generality, the vertical discrete Schottky diode 203 may be a model SB140 from Diodes Incorporated of Westlake Village, Calif.

Figure 2C:
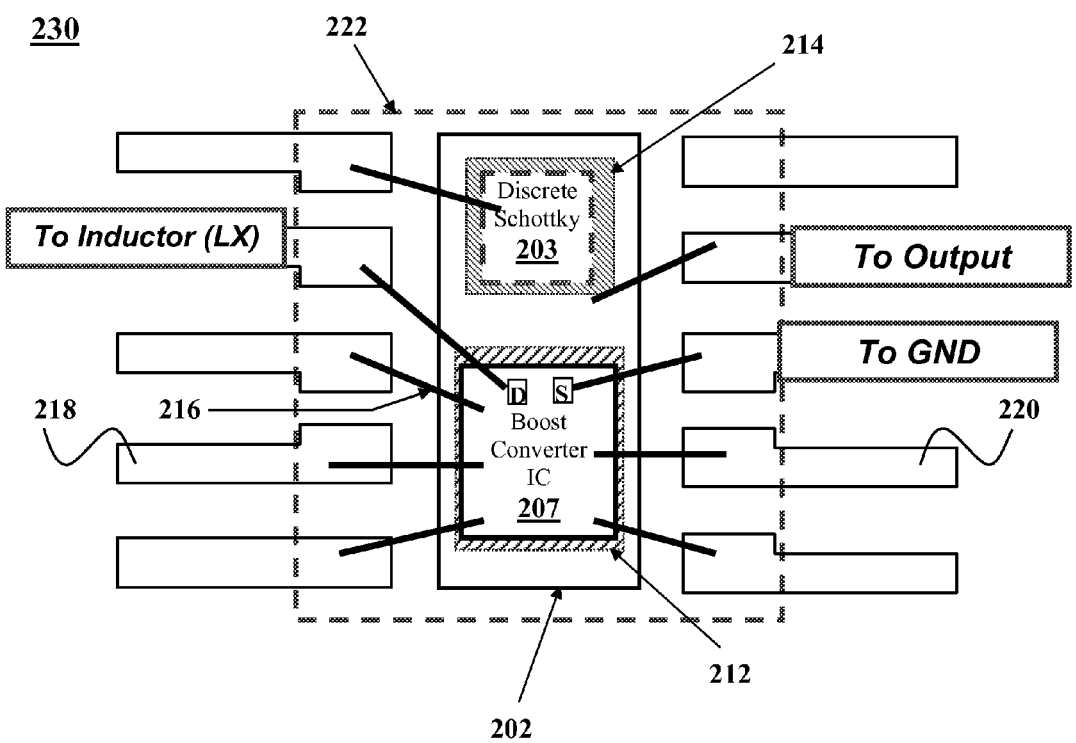
FIG. 2C is a top view of a boost IC package assembly of the boost converter of FIG. 2A.
Figure 2D:
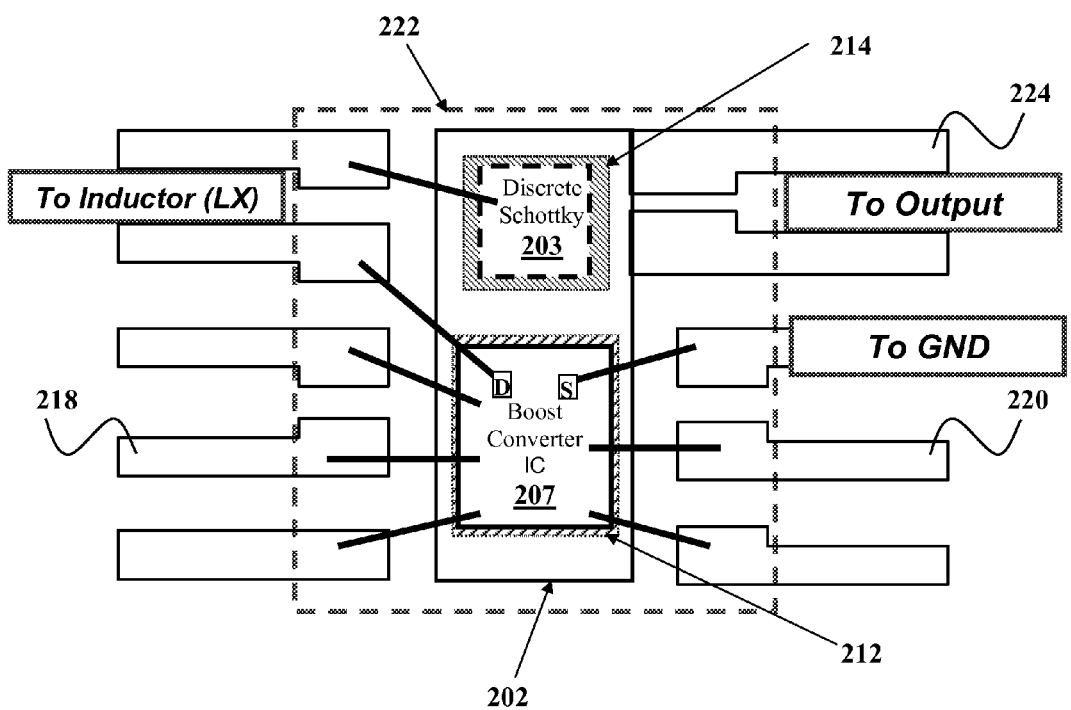
FIG. 2D is a top view of an alternative boost IC package assembly of the boost converter of FIG. 2A.

The anode 208 of the discrete Schottky diode 203 may be bonded directly to the drain D of the NFET 205 on the IC, or to the common package pin at junction J. The bottom cathode 210 may be directly coupled to the output voltage $V_{OUT}$. The source S of the discrete NFET 205 may be directly coupled to ground. An external inductor L may be directly coupled between the input voltage $V_{IN}$ and drain D of the discrete NFET 205. A capacitor C may be coupled between the bottom cathode 210 of the vertical discrete Schottky diode 203 and ground. An output voltage $V_{OUT}$ may be obtained at a point between the cathode 210 of the Schottky diode 203 and the capacitor C. The boost converter IC 207 and the discrete Schottky diode 203 may be co-packaged on a common die pad 202, such as a standard single die pad lead frame, which may be electrically connected to the bottom cathode 210 of the discrete Schottky diode 203. The die pad 202 can be held at the output voltage $V_{OUT}$ as a result of the bonding. Since the output voltage $V_{OUT}$ is free of any large signal switching waveforms, the noise injected into the Boost IC substrate of the die pad 202 will be minimal FIG. 2C and FIG. 2D are top plan views of a boost IC package assemblies of the boost converter 200 as described in FIG. 2A. Typically, FIG. 2C illustrates a boost IC package assembly 230 of the boost converter 200 in which the boost converter IC 207 contains a P-type substrate that is in electrical contact with a ground voltage. The P-type substrate is typically connected to ground to reverse bias the junction between substrate and active circuits. As shown in FIG. 2C, the boost converter IC 207, which contains the controller 201 and the NFET 205, is attached on the die pad 202 with a layer of non-conductive or insulating epoxy 212 deposited between the boost converter IC 207 and the die pad 202. The discrete Schottky diode 203 is attached on the die pad 202 with a conductive epoxy layer 214 deposited between the bottom cathode 210 of the discrete Schottky diode 203 and the die pad 202. The boost converter IC 207 and the discrete Schottky diode 203 are co-packaged on common die pad 202, such as a standard single die pad lead frame. The boost converter IC 207 and the discrete Schottky diode 203 are electrically connected to leads 218, 220 by bond wires 216. All the components may be packaged in a plastic package 222. The bottom cathode 210 of the discrete Schottky diode 203 may be electrically connected to the output voltage through the die pad 202 and a bond wire 216. The drain D of the NFET located on the boost converter IC 207 may also electrically be connected to the inductor L through bond wires 216. The source S of the NFET located on the boost converter IC 207 may also electrically be connected to the GND pin through bond wires 216. Preferably, the insulating epoxy layer 212 is sufficiently thick and/or insulative to be able to stand off a DC voltage differential equivalent to the drop across the substrate of the boost converter IC 207.

FIG. 2D illustrates a boost IC package assembly 240 containing the boost converter 200 where the boost converter IC 207 contains an N-type substrate that is electrically connected to the output voltage. The source S of the NFET located on the boost converter IC 207 may also electrically be connected to the GND pin through bond wires 216. The boost IC package assembly 240 is similar to the IC package assembly 230 except that the bottom cathode 210 of the discrete Schottky diode 203 is electrically connected to leads 224 in direct contact with the die pad 202 and the top anode 208 of the discrete Schottky diode 203 is electrically connected to the inductor L through a bond wire 216. In this case, a blocking voltage rating is not necessary.

The co-packaged configuration of the boost converter IC 207 and the discrete Schottky diode 203 on a common die pad 202 as shown in FIGS. 2A-2D provides the advantages of both low cost of manufacturing and small form factor.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A boost converter comprising:
a boost converter integrated circuit; and
a vertical discrete Schottky diode having a top anode and a bottom cathode
wherein the boost converter integrated circuit and the vertical discrete Schottky diode are co-packaged on a common die pad, wherein the boost converter integrated circuit is electrically isolated from the common die pad and wherein a substrate of the boost converter integrated circuit is N-type and electrically connected to an output voltage.

2. The boost converter of claim 1, wherein the boost converter integrated circuit includes a controller and an N-type field effect transistor (NFET).

3. The boost converter of claim 2, wherein the controller and the N-type field effect transistor (NFET) are formed on a common semiconductor chip.

4. The boost converter of claim 2, wherein the top anode of the discrete Schottky diode is coupled to a drain of the NFET.

5. The boost converter of claim 1 wherein a substrate of the boost converter integrated circuit is P-type.

6. The boost converter of claim 5 wherein the substrate is electrically connected to a ground voltage.

7. The boost converter of claim 6 wherein the substrate is electrically isolated from the common die pad.

8. The boost converter of claim 6 wherein the substrate is electrically isolated from the common die pad with a non-conductive epoxy selected to withstand a full output voltage rating of the boost converter.

* * * * *